United States Patent
Dequina et al.

(10) Patent No.: US 7,088,151 B1
(45) Date of Patent: Aug. 8, 2006

(54) HIGH VOLTAGE GATE DRIVER USING A LOW VOLTAGE MULTI-LEVEL CURRENT PULSE TRANSLATOR

(75) Inventors: Noel B. Dequina, Bridgewater, NJ (US); Robert H. Isham, Flemington, NJ (US); Paul K. Sferrazza, New Hope, PA (US); Donald R. Preslar, Hillsborough, NJ (US)

(73) Assignee: Intersil Americas Inc., Milpitas, CA (US)

( * ) Notice: Subject to any disclaimer, the term of this patent is extended or adjusted under 35 U.S.C. 154(b) by 11 days.

(21) Appl. No.: 10/828,610

(22) Filed: Apr. 21, 2004

(51) Int. Cl.
  *H03B 1/00* (2006.01)
(52) U.S. Cl. ............... 327/108; 327/112; 327/170
(58) Field of Classification Search ............. 327/108, 327/110, 112, 380, 381, 382, 383, 388, 389, 327/309, 310; 326/82, 83, 87
  See application file for complete search history.

(56) References Cited

U.S. PATENT DOCUMENTS

| 6,037,811 | A  | * | 3/2000  | Ozguc       | 327/108 |
| 6,617,897 | B1 | * | 9/2003  | Lee         | 327/170 |
| 6,661,259 | B1 | * | 12/2003 | Tsuchi      | 327/108 |
| 6,731,151 | B1 | * | 5/2004  | Doutreloigne| 327/333 |
| 2005/0040866 | A1 | * | 2/2005 | Janssen    | 327/112 |

* cited by examiner

Primary Examiner—Tuan T. Lam
(74) Attorney, Agent, or Firm—Gary R. Stanford

(57) ABSTRACT

A multi-level current pulse generator for driving the gates of a CMOS pair implemented using a low voltage process including a multi-level pulse translator, a current amplifier circuit, and a clamp circuit. The multi-level pulse translator generates a multi-level current pulse on at least one pulse node, each current pulse having a first large current pulse with short duration followed by at least one smaller current pulse of longer duration and operative to switch the CMOS pair with reduced average power dissipation. The current amplifier circuit amplifies the current pulses provided to the gates of the CMOS pair. The clamp circuit clamps gate voltage of the CMOS pair to prevent breakdown. In a tri-level case, a first current pulse charges and discharges gate capacitance, a second current pulse stabilizes gate voltage, and a third current pulse provides a holding current level.

27 Claims, 3 Drawing Sheets

HIGH VOLTAGE GATE DRIVER USING A LOW VOLTAGE MULTI-LEVEL CURRENT PULSE TRANSLATOR

BACKGROUND OF THE INVENTION

1. Field of the Invention

The present invention relates to power electronics and DC—DC converters, and more particularly to a high voltage gate driver using a low voltage multi-level current pulse translator implemented using a low voltage process and optimized for high speed and low power dissipation.

2. Description of the Related Art

Modern DC—DC converters typically employ one or more 12 Volt (V) gate drivers or the like to drive electronic switching devices, such as metal-oxide semiconductor field-effect transistors (MOSFETs), to convert a high voltage DC input (e.g., 24V) to a regulated output voltage. The original 12V gate drivers were implemented using high voltage processes because of the higher voltage levels being switched and to drive sufficient current to turn on and off the switching devices. Although conventional gate drivers implemented using high voltage processes were initially recognized as high performance and cost effective, increasing demand for higher performance, lower cost solutions in smaller, mobile applications has made the higher voltage processes obsolete. Newer, low voltage processes are available, such as 5V processes and the like, which offer significantly reduced power consumption, reduced die and package size, reduced propagation delays (due to the gate oxide thickness typically defined by the process), lower cost and greater efficiency. Yet it is still desired to provide power electronics that switch at higher voltage levels, such as 12V.

It is desired to provide a 12V gate driver that can offer better performance and cost effective part in the motherboard solution.

SUMMARY OF THE INVENTION

A multi-level current pulse generator for driving the gates of a CMOS pair implemented using a low voltage process according to an embodiment of the present invention includes a multi-level pulse translator, a current amplifier circuit, and a clamp circuit. The multi-level pulse translator generates a multi-level current pulse on each of one or more pulse nodes, each multi-level current pulse having a first large current pulse with short duration followed by at least one smaller current pulse of longer duration and operative to switch the CMOS pair with reduced average power dissipation. The current amplifier circuit has at least one input and a pair of outputs, each input for coupling to a corresponding pulse node and the outputs for coupling to the gates of the CMOS pair. The clamp circuit clamps gate voltage of the CMOS pair to prevent breakdown.

The multi-level pulse translator and the current amplifier circuit may collectively operate to generate an amplified multi-level current pulse to have a large first current pulse with a short duration, an intermediate second current pulse with an intermediate duration, and a third low current pulse with a long duration to minimize average power dissipation. In one embodiment, the first current pulse is sufficient to charge and discharge gate capacitance of the CMOS pair, the second current pulse stabilizes gate voltage of the CMOS pair, and the third current pulse provides a holding current level.

The multi-level pulse translator may include multiple current sources, multiple switches and a pulse timing circuit. In this case, each switch is coupled to a corresponding current source and to a pulse node, and the pulse timing circuit controls the switches to generate a multi-level current pulse on each pulse node. In one embodiment, the multi-level pulse translator receives a PWM signal and generates a first multi-level current pulse on a first pulse node when the PWM signal is asserted to a first state and a second multi-level current pulse on the second pulse node when the PWM signal is asserted to a second state. The current amplifier circuit includes a first current mirror amplifier having a first input coupled to the first pulse node and a second current mirror amplifier having a second input coupled to the second pulse node. The first and second current amplifiers each have a pair of outputs for coupling to the gates of the CMOS pair for driving the CMOS pair into a first collective state in response to the first multi-level current pulse and into a second collective state in response to the second multi-level current pulse.

In a more specific embodiment, the CMOS pair includes a P-channel device and an N-channel device. The first current mirror amplifier is operative to draw current from the gates of the P-channel and N-channel devices to turn on the P-channel device and to turn off the N-channel device. The second current mirror amplifier is operative to inject current into the gates of the P-channel and N-channel devices to turn on the N-channel device and to turn off the P-channel device.

The clamp circuit may include a pull-up clamp circuit and a pull-down clamp circuit. The pull-up clamp circuit is operative to prevent the gate of the P-channel device from falling below a first voltage level and the pull-down clamp circuit is operative to prevent the gate of the N-channel device from rising above a second voltage level.

A high voltage gate driver implemented using a low voltage process according to an embodiment of the present invention includes a P-channel device, an N-channel device, a multi-level current pulse generator, and a clamp circuit. Each of the P-channel and N-channel devices have a gate and also have a drain and a source coupled together at an intermediate junction and in series between high voltage source terminals. The multi-level current pulse generator provides at least one multi-level current pulse to the gates of the P-channel and N-channel devices sufficient to switch the P-channel and N-channel devices while minimizing average power dissipation. The clamp circuit is coupled to limit gate to source voltage of the P-channel and N-channel devices to a predetermined maximum level.

In one embodiment, the P-channel device is a PDMOS transistor having a source coupled to a high voltage source and a drain coupled to the intermediate junction, and the N-channel device is an NDMOS transistor having a drain coupled to the intermediate junction and a source coupled to a reference node. The PDMOS and NDMOS devices are each implemented with an extended drain-to-source diffusion layer.

A method of driving a high voltage switching device using a gate driver implemented using a low voltage process according to an embodiment of the present invention includes generating at least one multi-level current pulse sufficient to modulate the gates of a P-channel device and an N-channel device with reduced average power dissipation, and clamping the gates of the P-channel device and the N-channel device to predetermined voltage levels to prevent breakdown.

The method may include controllably switching a plurality of current sources, which may further include activating multiple current sources at the beginning of a PWM period and turning off the current sources one by one. The method may include generating a large first current pulse with a short duration, generating a successive intermediate second current pulse with an intermediate duration, and generating a successive third low current pulse with a long duration. The method may further include generating a first current pulse sufficient to charge and discharge gate capacitance, generating a second current pulse sufficient to stabilize gate voltage, and generating a third current pulse to provide a holding current. The method may include amplifying current pulses using current mirrors.

The method may include generating a first multi-level current pulse, applying the first multi-level current pulse to the gates of the P-channel and N-channel devices to turn the P-channel device on and to turn the N-channel device off, generating a second multi-level current pulse, and applying the second multi-level current pulse to the gates of the P-channel and N-channel devices to turn the P-channel device off and to turn the N-channel device on. The method may include generating the first multi-level current pulse in response to assertion of a PWM signal and generating the second multi-level current pulse in response to de-assertion of the PWM signal.

The method may include clamping the gate of the P-channel device from dropping below a minimum voltage level to prevent breakdown, and clamping the gate of the N-channel device from rising above a maximum voltage level to prevent breakdown.

BRIEF DESCRIPTION OF THE DRAWINGS

The benefits, features, and advantages of the present invention will become better understood with regard to the following description, and accompanying drawings where.

DETAILED DESCRIPTION

The following description is presented to enable one of ordinary skill in the art to make and use the present invention as provided within the context of a particular application and its requirements. Various modifications to the preferred embodiment will, however, be apparent to one skilled in the art, and the general principles defined herein may be applied to other embodiments. Therefore, the present invention is not intended to be limited to the particular embodiments shown and described herein, but is to be accorded the widest scope consistent with the principles and novel features herein disclosed.

A high voltage gate driver using low voltage multi-level current pulse translator according to an embodiment of the present invention provides a cost effective solution using lower voltage processes to achieve smaller die size and more efficient operation yet achieves technical performance comparable to existing drivers employing higher voltage processes. Technical advantages include smaller die size, reduced dead time and propagation delay, significantly reduced power dissipation during dynamic conduction, and lower cost.

Figure 1:
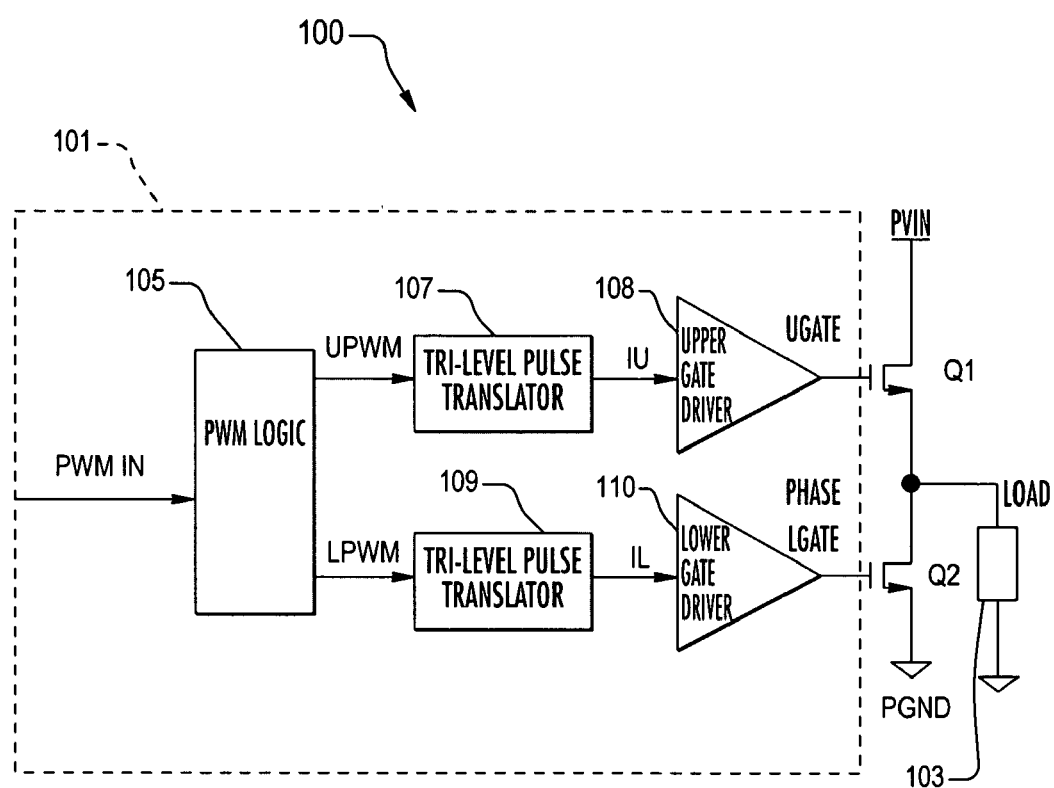
FIG. 1 is a simplified block diagram of a DC—DC converter employing a high voltage gate driver using low voltage multi-level current pulse translators implemented according to an embodiment of the present invention.

FIG. 1 is a simplified block diagram of a DC—DC converter 100 employing a high voltage gate driver 101 using low voltage multi-level current pulse translators 107, 109 implemented according to an embodiment of the present invention. The gate driver 101 outputs an upper gate drive signal UGATE to the gate of an upper switching device Q1 and a lower gate drive signal LGATE to the gate of a lower switching device Q2. The switching devices Q1 and Q2 are illustrated as N-channel MOSFETs, although other types of electronic switching devices are contemplated. The switching devices Q1 and Q2 have their drains and sources coupled in series between input voltage source terminals, including a power input voltage PVIN and power ground PGND. In particular, Q1 has its drain coupled to PVIN and its source coupled to the drain of Q2 at an intermediate PHASE node, and the source of Q2 is coupled to PGND. The PHASE node is coupled to a load 103 referenced to PGND. Although not shown, additional components are included as known to those skilled in the art, such as an output power inductor, output filter capacitor, sensing devices, etc.

The gate driver 101 receives an input pulse-width modulation (PWM) signal PWM IN from control logic (not shown), where the PWM IN signal is provided to PWM logic 105 within the gate driver 101. The PWM logic 105 provides upper and lower PWM signals UPWM and LPWM to a pair of tri-level pulse translators 107 and 109, respectively. In the illustrated embodiment, the current pulses are "tri" level including three different levels although any number of different current levels are contemplated for each current pulse. The upper tri-level pulse translator 107 provides an upper current pulse signal IU to an upper gate driver 108 and the lower tri-level pulse translator 109 provides a lower current pulse signal IL to a lower gate driver 110. The upper gate driver 108 generates and provides the UGATE signal to the gate of Q1 and the lower gate driver 110 generates and provides the LGATE signal to the gate of Q2. The PWM logic 105 generally controls timing of the UGATE and PGATE of the switching devices Q1 and Q2 as known to those skilled in the art to convert power from PVIN to a regulated voltage appropriate for providing power to the load 103.

In conventional designs, the upper and lower gate drivers asserting the UGATE and LGATE signals were implemented using high voltage processes considered appropriate for driving the gates of the switching devices Q1 and Q2 via the UGATE and LGATE signals, respectively. Thus, the gate driver 101, if implemented on an integrated circuit (IC), was implemented using the higher voltage processes resulting in increased die size, higher power consumption, increased propagation delay time, etc. The tri-level pulse translators 107 and 109 and the gate drivers 108 and 110, however, are implemented using lower voltage processes so that the entire gate driver 101 may be implemented on a single IC using the lower voltage processes thereby enabling smaller die size, reduced propagation delay, reduced power consumption, reduced cost, among other benefits.

Figure 2:
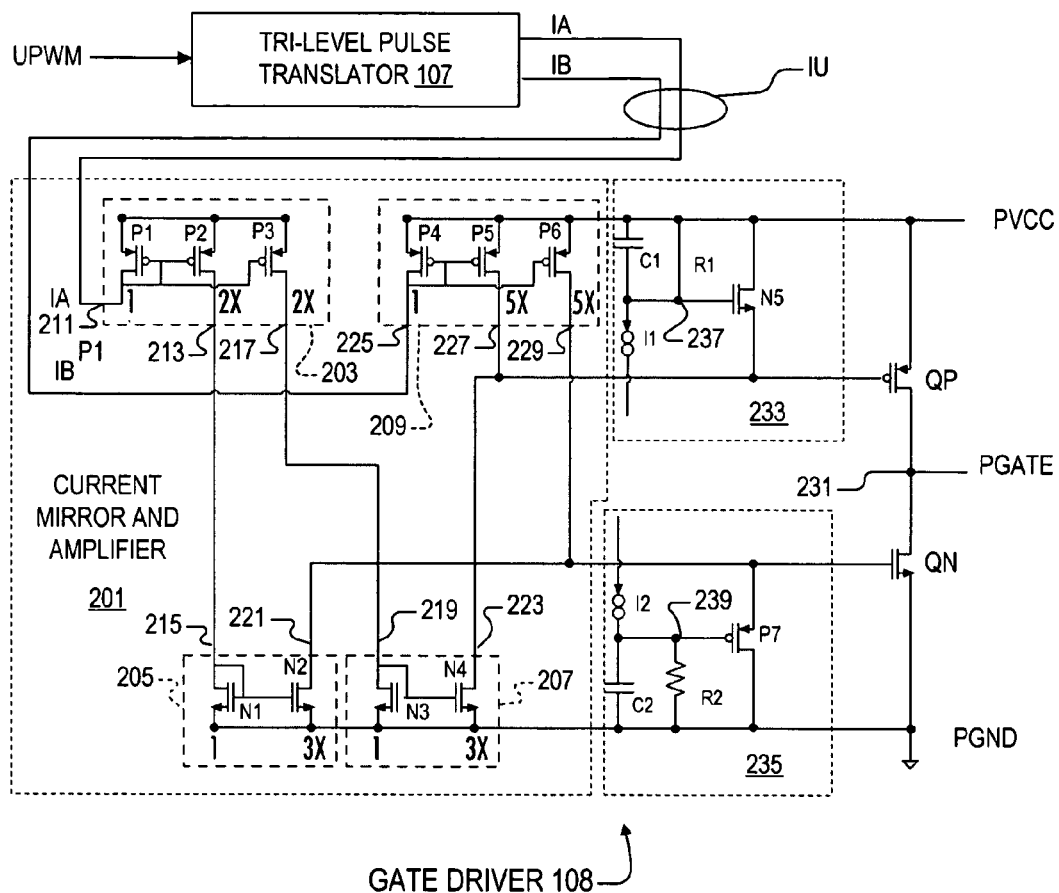
FIG. 2 is a more detailed block and schematic diagram of the tri-level pulse translator and the gate driver of FIG. 1 implemented according to an exemplary embodiment of the present invention.

FIG. 2 is a more detailed block and schematic diagram of the tri-level pulse translator 107 and the gate driver 108 implemented according to an exemplary embodiment of the present invention. The tri-level pulse translator 109 and the gate driver 110 are implemented in substantially the same manner and thus need not be shown for a full and complete understanding of the present invention. The UPWM signal is provided to an input of the tri-level pulse translator 107, which generates a first current pulse IA and a second current pulse IB, which collectively form the IU signal. The IA and IB current pulse signals are provided on respective pulse nodes 211 and 225 to respective inputs of a current amplifier circuit 201 of the upper gate driver 108. In the embodiment illustrated, the current amplifier circuit 201 includes four amplifying current mirrors 203, 205, 207 and 209. The IA pulse signal is provided to the pulse node 211 at the of the current mirror 203, which has a first current output node 213 provided to an input node 215 of the current mirror 205 and a second current output node 217 provided to an input node 219 of the current mirror 207. The current mirror 205 has an output node 221 provided to the gate of an N-channel MOS transistor QN and the current mirror 207 has an output node 223 provided to the gate of a P-channel MOS transistor QP. The IB pulse signal is provided to the pulse node 225 at the input of the current mirror 209, which has a first output node 227 provided to the gate of QP and a second output node 229 provided to the gate of QN.

The source of QP is coupled to a source voltage PVCC and its drain is coupled to a node 231 which develops the PGATE signal. The node 231 is coupled to the drain of QN, having its source coupled to PGND. The QN and QP transistors collectively form a CMOS pair for driving the PGATE signal. In the embodiment illustrated, PVCC is 12V, although other voltage levels are contemplated. The P-channel MOS transistor QP is a low voltage PDMOS transistor and the N-channel MOS transistor QN is a low voltage NDMOS transistor. The PDMOS and NDMOS transistors described herein are implemented with an extended drain-to-source diffusion layer and thus are capable of withstanding higher voltages from drain to source. However, the PDMOS and NDMOS transistors have a gate-to-source (VGS) breakdown voltage level of approximately 7V, so that that it is desired to limit VGS to a maximum voltage level of 5V. To prevent excessive voltage and to prevent breakdown of the QP and QN transistors, the gate driver 108 includes a first clamp circuit 233 coupled between PVCC and the gate of QP and another clamp circuit 235 coupled between PGND and the gate of QN.

The current mirror 203 includes P-channel MOS transistors P1, P2 and P3 having their sources coupled to PVCC. The drain of P1 is coupled to the pulse node 211, and is further coupled to the gates of P1, P2 and P3. The drain of P2 provides current via the output node 213 and the drain of P3 provides current via the output node 217. In this manner, the IA current signal at the pulse node 211 is mirrored at the output node 213 and also at the output node 217. In a more specific embodiment, the P2 and P3 transistors are sized approximately twice the size of P1, so that the current at each of the output nodes 213 and 217 is two times (2×) IA. The current mirror 209 includes P-channel MOS transistors P4, P5 and P6 having their sources coupled to PVCC. The drain of P4 is coupled to the pulse node 225, and is further coupled to the gates of P4, P5 and P6. The drain of P5 provides current via the output node 227 and the drain of P6 provides current via the output node 229. In this manner, the IB current signal at the pulse node 225 is mirrored at the output nodes 227 and 229. In a more specific embodiment, the P5 and P6 transistors are sized approximately five times the size of P4, so that the current at each of the output nodes 227 and 229 is five times (5×) IB.

The current mirror 205 includes N-channel MOS transistors N1 and N2 having their sources coupled to PGND. The drain of N1 is coupled to the input node 215, and is further coupled to the gates of N1 and N2. The drain of N2 provides current via the output node 221 of the current mirror 205. In this manner, the current signal from the output node 213 of the current source 203 provided at the input node 215 is mirrored at the output node 221 of the current mirror 205. In a more specific embodiment, the N2 transistor is sized approximately three times the size of N1, so that the current at the output node 221 is three times (3×) that output from the current mirror 203, or six times (6×) IA. The current mirror 207 includes N-channel MOS transistors N3 and N4 having their sources coupled to PGND. The drain of N3 is coupled to the input 219, and is further coupled to the gates of N3 and N4. The drain of N4 provides current via the output node 223 of the current mirror 207. In this manner, the current signal from the output node 217 of the current source 203 provided at the input node 219 is mirrored at the output node 223 of the current mirror 207. In a more specific embodiment, the N4 transistor is sized approximately three times the size of N3, so that the current at the output 223 is three times (3×) that output from the current mirror 203, or six times (6×) IA.

The clamp circuit 233 includes a capacitor C1 and a resistor R1 coupled in parallel between PVCC and a node 237, which is coupled to the gate of an N-channel NDMOS transistor N5. The drain of N5 is coupled to PVCC and the source of N5 is coupled to the gate of QP. A bias current device I1 is coupled to the node 237 and draws a bias current from the node 237. In one embodiment, the bias current is approximately 10 microamperes (μA) and the devices C1, R1 and N5 are configured to maintain the voltage at node 237 at approximately 8V. The clamp circuit 233 operates as a pull-up clamp circuit to clamp the gate of QP from falling below approximately 7V, so that the VGS of QP is limited to a maximum of 5V assuming that PVCC is 12V.

The clamp circuit 235 includes a capacitor C2 and a resistor R2 coupled in parallel between PGND and a node 239, which is coupled to the gate of a P-channel PDMOS transistor P7. The drain of P7 is coupled to PGND and the source of P7 is coupled to the gate of QN. A bias current device I2 is coupled to the node 239 and draws a bias current from the node 239. In one embodiment, the bias current of I2 is approximately 10 μA and the devices C2, R2 and P7 are configured to maintain the voltage at node 239 at approximately 4V. The clamp circuit 235 operates as a pull-down clamp circuit to clamp the gate of QN from rising above approximately 5V, so that the VGS of QN is limited to a maximum of 5V.

In the embodiment illustrated, the clamp circuits 233 and 235 are designed to be fast during voltage clamping and are thermally compensated to ensure that the bias voltages (at nodes 237 and 239) are kept constant during temperature changes. The clamp devices N5 and P7 are relatively large to achieve a relatively low effective MOS resistance during clamping, which prevents a large dip on the gates of QP and QN due to the current pulses applied. Uncompensated bias currents (via current devices I1 and I2) are used to set up the gate voltages of N5 and P7, so that if and when the temperature rapidly changes, the resistors R1 and R2 that bias the gates of N5 and P7, respectively, provide compensation due to changes of bias current. The capacitors C1 and C2 are relatively large, high frequency capacitors so that the devices N5 and P7 are relatively quiet during switching.

Figure 3:
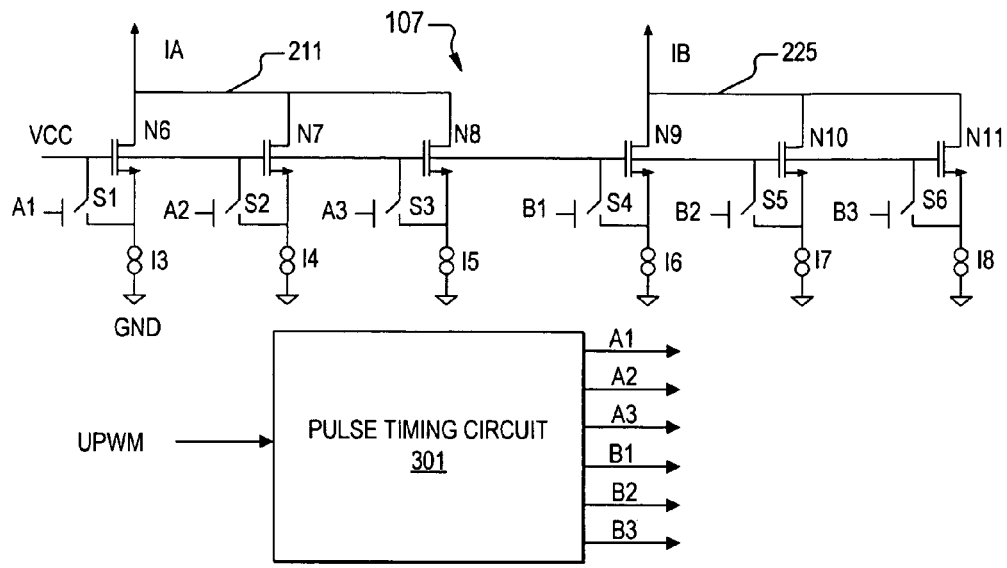
FIG. 3 is a more detailed block and schematic diagram of the tri-level pulse translator of FIG. 1.

FIG. 3 is a more detailed block and schematic diagram of the tri-level pulse translator 107. The tri-level pulse translator 109 is substantially identical to the tri-level pulse translator 107 and is not further described. The UPWM signal is provided to an input of a pulse timing circuit 301, which generates six logic timing signals A1, A2, A3, B1, B2 and B3. The timing signals A1–A3 control switches S1, S2 and S3, respectively, and the timing signals B1–B3 control switches S4, S4 and S6, respectively. The switches S1–S3 are coupled to three N-channel NDMOS transistors N6, N7 and N8, respectively, and the switches S4–S6 are coupled to three N-channel NDMOS transistors N9, N10 and N11, respectively. The gates of the transistors N6–N11 are coupled to a source signal VCC. In the embodiment illustrated, VCC is 5V, although other voltage levels are contemplated. The drains of N6–N8 are coupled together at the pulse node 211 to develop the IA current pulse signal. The drains of N9–N11 are coupled together at the pulse node 225 to develop the IB current pulse signal. The sources of the transistors N6–N11 are coupled to bias current sources I3, I4, I5, I6, I7 and I8, respectively, which are referenced to a power reference terminal, such as ground GND.

The signal A1 is asserted to close the switch S1, which activates the transistor N6 to enable the bias current from the current source I3 to contribute current to IA. In a similar manner, the signals A2 and A3 are asserted to close the switches S2 and S3, respectively, which activate the transistors N7 and N8, respectively, to enable the bias current from the current sources I4 and I5, respectively, to contribute current to IA. In a similar manner, the signals B1, B2 and B3 are asserted to close the switches S4, S5 and S6, respectively, which activate the transistors N9, N10 and N11, respectively, to enable the bias current from the current sources I6, I7 and I8, respectively, to contribute current to IB.

Figure 4:
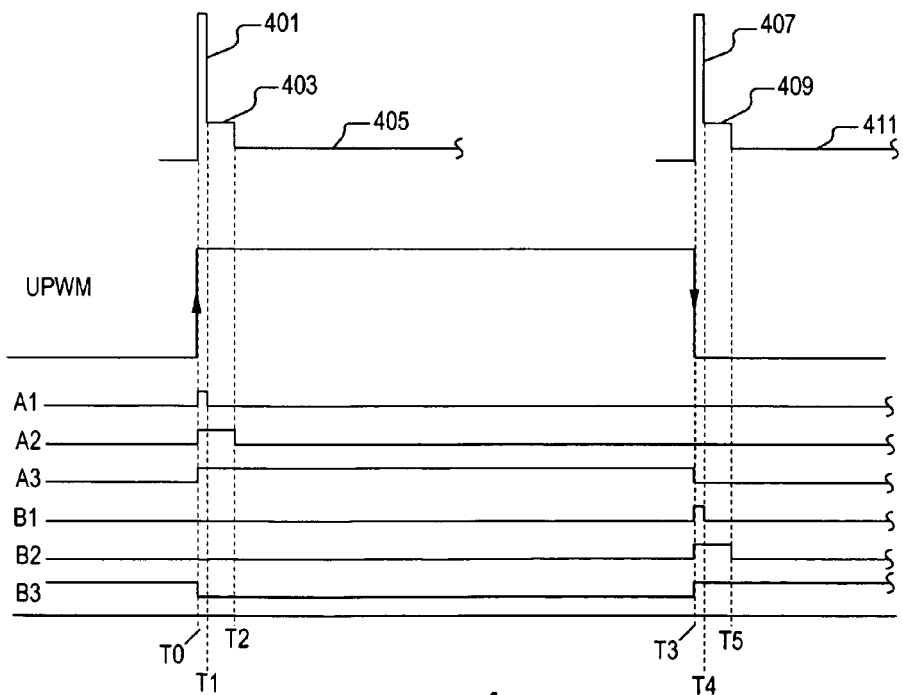
FIG. 4 is a timing diagram illustrating the operation of the pulse timing circuit of FIG. 3 and the corresponding timing relationships of the UPWM signal, the timing logic signals A1–A3 and B1–B3, and the resulting current pulse signals IA and IB.

FIG. 4 is a timing diagram illustrating the operation of the pulse timing circuit 301 and the corresponding timing relationships of the UPWM signal, the timing logic signals A1–A3 and B1–B3, and the resulting current pulse signals IA and IB. At a time T0, the UPWM signal is asserted high by the PWM logic 105 to activate the upper switching device Q1 via the upper gate driver 108. The pulse timing circuit 301 responds by asserting the A1, A2 and A3 signals and de-asserting the B3 signal which was asserted in the immediately prior PWM cycle. From time T0 to a subsequent time T1, the A1–A3 signals are asserted together so that the current of the IA signal is the sum of the current from the current devices I3, I4 and I5. This results in a relatively large current pulse 401 on the IA current signal having a duration from time T0 to time T1. At time T1, the pulse timing circuit 301 de-asserts the A1 signal so that the current device I3 is decoupled from node 211. The current devices I4 and I5 remain on resulting in a reduced current pulse 403 on the IA current pulse signal having a duration from time T1 to a subsequent time T2. At time T2, the pulse timing circuit 301 de-asserts the A2 signal so that the current device I4 is decoupled from node 211, so that only current device I5 is contributing to the IA signal. This results in a reduced current "pulse" or current level shown at 405 on the IA current pulse signal having a duration from time T2 to whenever the pulse timing circuit 301 de-asserts the A3 signal. In the embodiment illustrated, the pulse timing circuit 301 keeps the A3 signal asserted until the UPWM signal is de-asserted at a subsequent time T3.

At time T3, the UPWM signal is de-asserted low by the PWM logic 105 to turn off the upper switching device Q1 via the upper gate driver 108. The pulse timing circuit 301 responds by asserting the B1, B2 and B3 signals and de-asserting the A3 signal which was asserted in the immediately prior PWM cycle. From time T3 to a subsequent time T4, the B1–B3 signals are asserted together so that the current of the IB signal is the sum of the current from the current devices I6, I7 and I8. This results in a relative large current pulse 407 on the IB current pulse signal having a duration from time T3 to time T4. At time T4, the pulse timing circuit 301 de-asserts the B1 signal so that the current device I6 is decoupled from node 225. This results in a reduced current pulse 409 on the IB signal from current devices I7 and I8 having a duration from time T4 to a subsequent time T5. At time T5, the pulse timing circuit 301 de-asserts the B2 signal so that the current device I7 is decoupled from node 225, so that only current device I8 is contributing to the IB signal. This results in a lower current pulse or current level shown at 411 on the IB current signal having a duration from time T5 to whenever the pulse timing circuit 301 de-asserts the B3 signal. In the embodiment illustrated, the pulse timing circuit 301 keeps the B3 signal asserted until the UPWM signal is asserted again in the next PWM cycle.

In one embodiment, the pulse timing circuit 301 is implemented using capacitors and corresponding precision constant bias current devices (not shown) to set the pulse width durations. Thus, for the tri-level current pulse case, six different timing circuits define the pulse durations of the A1–A3 and B1–B3 timing signals, which in turn define the durations of the pulses 401, 403, 405, 407, 409 and 411. In the general case for different numbers of current pulses, a corresponding number of precision timing circuits is provided. Such precision timing circuits are known by those skilled in the art and not further described herein.

In the particular embodiment illustrated, the current devices I3 and I6 generate approximately the same level of current, the current devices I4 and I7 generate approximately the same level of current, and the current devices I5 and I8 generate approximately the same level of current, so that the current pulse signatures (e.g., profiles) of IA and IB current pulse signals are substantially the same. The IA current pulses are employed to turn on Q1 in response to the UPWM signal being asserted high and the IB current pulses are employed to turn off Q1 in response to the UPWM signal being de-asserted low. Referring back to FIG. 2, the IA current is mirrored and amplified by the current mirrors 203, 205 and 207 and applied to the gates of QP and QN. Since the current is pulled away from the gates of QN and QP, the voltages at the gates of QN and QP are reduced, which turns QN off and turns QP on. In this manner, the PGATE signal is pulled high to turn on the switching device Q1. When the UPWM signal is pulled low, the IB current is mirrored and amplified by the current mirror 209 and applied to the gates of QP and QN. Since the resulting current is injected into the gates of QP and QN, their gate voltages increase which operates to turn QN on and to turn QP off. In this manner, the PGATE signal is pulled low to turn off the switching device Q1.

The initial pulse 401 or 407 is a relatively large current pulse with a relatively short duration and is the main current pulse used to discharge/charge the gate capacitance of the transistors QN and QP. The second current pulse 403 or 409 has an intermediate magnitude (i.e., smaller than the magnitude of the initial pulse) with an intermediate duration (longer than the first pulse) and is used to stabilize gate voltage thereby preventing the transistors from accidentally turning on or off due to the heavy concentration of the gate capacitance. The last "pulse" or current signal 405 or 411 is a relatively low magnitude current signal used as a holding current. In the embodiment illustrated, the holding current level 405 or 411 lasts the entire applicable half of the PWM cycle. In a particular embodiment employed for a switching frequency of less than 500 kilohertz (kHz), sufficiently reduced power dissipation is achieved using an initial pulse 401/407 of IA/IB of approximately 15 milliamperes (mA) for a duration of approximately 15 nanoseconds (ns), a second pulse 403/409 of approximately 4 mA for approximately 60 ns, and a low level current of approximately 20 µA. Note that the IA current pulse signal is amplified by a factor of six, so that the magnitudes of the current levels at the gates of the transistors QP and QN caused by the pulses 401, 403 and 405 of the IA signal are 90 mA, 24 mA and 120 µA (or 0.12 mA), respectively. The IB current is amplified by a factor of five, so that the magnitudes of the current levels at the gates of the transistors QP and QN caused by the pulses 407, 409 and 411 of the IB signal are 75 mA, 20 mA and 100 µA (or 0.1 mA), respectively. In this manner, the tri-level pulse translator 107 and the current amplifier circuit 201 collectively operate as a multi-level current pulse generator sufficient for modulating or driving the QP/QN CMOS pair with reduced average power dissipation.

In the configuration illustrated, the current devices I3 and I6 provide approximately 11 mA, the current devices I4 and I7 provide approximately 4 mA, and the current devices I5 and I8 provide approximately 20 µA. Note, for example, that the current devices I3 and I4 (or I6 and I7) combine to provide approximately 15 mA, where the current devices I5 and I8 provide relatively negligible levels of current in comparison. In an alternative embodiment, the current devices I3–I8 are activated one at a time. Thus, for example, the current device I3 is on between times T0 and T1 and otherwise off, the current device I4 is on between times T1 and T2 but otherwise off, the current device I5 is on between times T2 and T3 but otherwise off, the current device I6 is on between times T3 and T4 but otherwise off, the current device I7 is on between times T4 and T5 but otherwise off, and the current device I8 is on from time T5 to when UPWM is next asserted high, but otherwise off. In this latter embodiment, the current devices I3 and I6 provide a current level of approximately 15 mA to achieve the desired current pulses at the gates of QN and QP.

A high voltage gate driver using a low voltage multi-level current pulse translator according to embodiments of the present invention uses well-controlled high current pulses to charge/discharge the gate capacitance of a complementary pair of gate drive MOS transistors that drive the switching devices of a DC—DC power converter. The CMOS pair includes a P-channel transistor and an N-channel transistor coupled in series between power voltage signal terminals (e.g., PVCC and PGND) at an intermediate node that drives a respective one of output switching devices. Average power dissipation is reduced using a multi-level current pulse, which includes an initial short duration, high current pulse to charge/discharge gate capacitance, followed by an intermediate magnitude and intermediate duration current pulse for stabilization, followed a long duration, low magnitude current pulse for maintaining activation state of the complementary gate drive transistors.

A first current pulse signature is employed for a turn-on event in which the P-channel gate drive device is turned on and the N-channel gate drive device is turned off. A second current pulse signature is employed for a turn-off event in which the P-channel gate drive device is turned off and the N-channel gate drive device is turned on. The first and second current pulse signatures may be substantially identical. A multi-level current pulse translator generates the current pulse signatures using precision timing circuits that selectively switch a series of current devices. Current mirrors are used to amplify the current pulse signatures to create sufficient current to modulate the gates of the complementary pair. A first set of current mirrors amplify the first current pulse signature for the turn-on event and a second set of current mirrors amplify the second current pulse signature for the turn-off event. Fast gate clamp circuits clamp the gates of the complementary pair of P-channel and N-channel devices to maintain the desired VGS voltages to a predetermined maximum voltage level to prevent breakdown.

Although the present invention has been described in considerable detail with reference to certain preferred versions thereof, other versions and variations are possible and contemplated. For example, although the present invention is illustrated using MOS devices and particular low and high voltage levels (e.g., 5V and 12V, respectively), other device types (e.g., bipolar transistors) and voltage levels are contemplated. The present invention is applicable to enable driving higher voltage devices using lower voltage processes and controlled current pulses. Those skilled in the art should appreciate that they can readily use the disclosed conception and specific embodiments as a basis for designing or modifying other structures for providing out the same purposes of the present invention without departing from the spirit and scope of the invention as defined by the appended claims.

What is claimed is:

1. A multi-level current pulse generator for driving the gates of a CMOS pair implemented using a low voltage process, comprising:
    a multi-level pulse translator that generates a multi-level current pulse on each of at least one pulse node, each said multi-level current pulse having a first large current pulse with short duration followed by at least one smaller current pulse of longer duration and operative to switch the CMOS pair with reduced average power dissipation;
    a current amplifier circuit having at least one input and a pair of outputs for coupling to the gates of the CMOS pair, each of said at least one input of said current amplifier circuit coupled to a corresponding one of said at least one pulse node; and
    a clamp circuit for clamping gate voltage of the CMOS pair to prevent breakdown.

2. The multi-level current pulse generator of claim 1, wherein said multi-level pulse translator comprises:
    a plurality of current sources;
    a plurality of switches, each coupled to a corresponding one of said at least one pulse node and to a corresponding one of said plurality of current sources; and
    a pulse timing circuit that controls said plurality of switches to generate a multi-level current pulse on each of said at least one pulse node.

3. The multi-level current pulse generator of claim 1, further comprising:
    said at least one pulse node comprising a first pulse node and a second pulse node;
    said multi-level pulse translator receiving a PWM signal having first and second states and generating a first multi-level current pulse on said first pulse node when said PWM signal is asserted to said first state and a second multi-level current pulse on said second pulse node when said PWM signal is asserted to said second state; and
    said current amplifier circuit comprising a first current mirror amplifier having a first input coupled to said first pulse node and a second current mirror amplifier having a second input coupled to said second pulse node;
    wherein each of said first and second current mirror amplifiers have a pair of outputs for coupling to the gates of the CMOS pair for driving the CMOS pair into a first collective state in response to said first multi-level current pulse and into a second collective state in response to said second multi-level current pulse.

4. The multi-level current pulse generator of claim 3, the CMOS pair including a P-channel device and an N-channel device, further comprising:
said first current mirror amplifier operative to draw current from the gates of the P-channel device and the N-channel device to turn on the P-channel device and to turn off the N-channel device; and
said second current mirror amplifier operative to inject current into the gates of the P-channel device and the N-channel device to turn on the N-channel device and to turn off the P-channel device.

5. The multi-level current pulse generator of claim 4, the P-channel device coupled to a high voltage source and the N-channel device coupled to ground, wherein said clamp circuit comprises:
a pull-up clamp circuit, for coupling between the high voltage source and the gate of the P-channel device, operative to prevent the gate of the P-channel device from falling below a first voltage level; and
a pull-down clamp circuit, for coupling between ground and the gate of the N-channel device, operative to prevent the gate of the N-channel device from rising above a second voltage level.

6. The multi-level current pulse generator of claim 5, wherein:
said pull-up clamp circuit comprises:
a second N-channel device having a gate and having a drain and source coupled between the high voltage source and the gate of the P-channel device;
a first resistor-capacitor circuit coupled between the high voltage source and said gate of said gate of said second N-channel device; and
a first current source coupled to said gate of said second N-channel device; and
wherein said pull-down clamp circuit comprises:
a second P-channel device having a gate and having a drain and source coupled between ground and the gate of the N-channel device;
a second resistor-capacitor circuit coupled between ground and said gate of said gate of said second P-channel device; and
a second current source coupled to said gate of said second P-channel device.

7. The multi-level current pulse generator of claim 1, wherein said multi-level pulse translator and said current amplifier circuit generates an amplified multi-level current pulse to have a large first current pulse with a short duration, an intermediate second current pulse with an intermediate duration, and a third low current pulse with a long duration to minimize average power dissipation.

8. The multi-level current pulse generator of claim 7, wherein said first current pulse is sufficient to charge and discharge gate capacitance of the CMOS pair, wherein said second current pulse stabilizes gate voltage of the CMOS pair, and wherein said third current pulse provides a holding current level.

9. A high voltage gate driver implemented using a low voltage process, comprising:
a P-channel device and an N-channel device, each having a gate and each having a drain and a source coupled together at an intermediate junction and in series between high voltage source terminals;
a multi-level current pulse generator that provides at least one predetermined multi-level current pulse to said gates of said P-channel and N-channel devices having a first large current pulse with short duration followed by at least one smaller current pulse of longer duration and sufficient to switch on and off said P-channel and N-channel devices while minimizing average power dissipation; and
a clamp circuit coupled to limit gate to source voltage of said P-channel and N-channel devices to a predetermined maximum level.

10. The high voltage gate driver of claim 9, wherein:
said P-channel device comprises a PDMOS transistor having a source coupled to a high voltage source and a drain coupled to said intermediate junction; and
said N-channel device comprises an NDMOS transistor having a drain coupled to said intermediate junction and a source coupled to a reference node;
wherein said PDMOS and NDMOS devices are each implemented with an extended drain-to-source diffusion layer.

11. The high voltage gate driver of claim 10, wherein said clamp circuit comprises a first clamp circuit coupled to prevent said gate of said PDMOS transistor from dropping below a first voltage level and a second clamp circuit coupled to prevent said gate of said NDMOS transistor from rising above a second voltage level.

12. The high voltage gate driver of claim 11, wherein said low voltage process is a 5 Volt process, wherein said high voltage source is approximately 12 Volts, wherein said reference node is approximately zero Volts, wherein said first voltage level is approximately 7 Volts, and wherein said second voltage level is approximately 5 Volts.

13. The high voltage gate driver of claim 9, wherein said multi-level current pulse generator comprises:
a plurality of switched current sources;
a pulse timing circuit that controls said plurality of switched current sources to generate each of said at least one multi-level current pulse with a first large current pulse having a short duration and at least one additional reduced size current pulse; and
a current amplifier coupled to said plurality of switched current sources and to said gates of said P-channel and N-channel devices.

14. The high voltage gate driver of claim 13, wherein said pulse timing circuit turns on said plurality of switched current sources at a beginning of a PWM period and turns off said plurality of switched current sources one at a time during said PWM period to generate each of said at least one multi-level current pulse.

15. The high voltage gate driver of claim 13, wherein said multi-level current pulse generator generates a large first current pulse with a short duration, an intermediate second current pulse with an intermediate duration, and a third low current pulse during said PWM period.

16. The high voltage gate driver of claim 15, wherein said first current pulse is sufficient to charge and discharge gate capacitance of said P-channel and N-channel devices, wherein said second current pulse stabilizes voltage of said gates of said P-channel and N-channel devices, and wherein said third current pulse provides a holding current level.

17. The high voltage gate driver of claim 9, wherein said multi-level current pulse generator provides a first multi-level current pulse to turn on said P-channel device and to turn off said N-channel device and provides a second multi-level current pulse to turn on said N-channel device and to turn off said P-channel device.

18. The high voltage gate driver of claim 17, wherein said multi-level current pulse generator comprises:
- a first current mirror amplifier that amplifies said first multi-level current pulse to pull current from said gates of said P-channel and N-channel devices; and
- a second current mirror amplifier that amplifies said second multi-level current pulse to inject current into said gates of said P-channel and N-channel devices.

19. A method of driving a high voltage switching device using a gate driver implemented using a low voltage process, comprising:
- providing at least one predetermined multi-level current pulse to the gates of a P-channel device and an N-channel device having a first large current pulse with short duration followed by at least one smaller current pulse of longer duration and sufficient to turn on and off the P-channel and N-channel devices with reduced average power dissipation; and
- clamping the gates of the P-channel device and the N-channel device to predetermined voltage levels to prevent breakdown.

20. The method of claim 19, wherein said generating at least one multi-level current pulse comprises controllably switching a plurality of current sources.

21. The method of claim 20, wherein said controllably switching a plurality of current sources comprises activating multiple current sources at the beginning of a PWM period and turning off the current sources one by one.

22. The method of claim 19, wherein said generating at least one multi-level current pulse comprises generating a large first current pulse with a short duration, generating a successive intermediate second current pulse with an intermediate duration, and generating a successive third low current pulse with a long duration.

23. The method of claim 19, wherein said generating at least one multi-level current pulse comprises generating a first current pulse sufficient to charge and discharge gate capacitance, generating a second current pulse sufficient to stabilize gate voltage, and generating a third current pulse to provide a holding current.

24. The method of claim 19, wherein said generating at least one multi-level current pulse comprises amplifying current pulses using current mirrors.

25. The method of claim 19, wherein said generating at least one multi-level current pulse comprises:
- generating a first multi-level current pulse;
- applying the first multi-level current pulse to the gates of the P-channel and N-channel devices to turn the P-channel device on and to turn the N-channel device off;
- generating a second multi-level current pulse; and
- applying the second multi-level current pulse to the gates of the P-channel and N-channel devices to turn the P-channel device off and to turn the N-channel device on.

26. The method of claim 25, wherein said generating a first multi-level current pulse comprises generating the first multi-level current pulse in response to assertion of a PWM signal and wherein said generating a second multi-level current pulse comprises generating the second multi-level current pulse in response to de-assertion of the PWM signal.

27. The method of claim 19, wherein said clamping the gates of the P-channel device and the N-channel device comprises:
- clamping the gate of the P-channel device from dropping below a minimum voltage level to prevent breakdown; and
- clamping the gate of the N-channel device from rising above a maximum voltage level to prevent breakdown.

* * * * *